(12) United States Patent
Fogel

(10) Patent No.: US 10,565,143 B2
(45) Date of Patent: *Feb. 18, 2020

(54) CIRCUITRY TO ALLEVIATE PRINTED CIRCUIT BOARD ROUTING CONGESTION

(71) Applicant: Toshiba Memory Corporation, Tokyo (JP)

(72) Inventor: David Fogel, San Jose, CA (US)

(73) Assignee: Toshiba Memory Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/245,712

(22) Filed: Jan. 11, 2019

(65) Prior Publication Data

US 2019/0146938 A1   May 16, 2019

Related U.S. Application Data

(63) Continuation of application No. 15/455,993, filed on Mar. 10, 2017, now Pat. No. 10,198,381.

(51) Int. Cl.
*G06F 13/28* (2006.01)
*G06F 3/06* (2006.01)
*G06F 13/16* (2006.01)

(52) U.S. Cl.
CPC ........ *G06F 13/287* (2013.01); *G06F 13/1684* (2013.01)

(58) Field of Classification Search
None
See application file for complete search history.

(56) References Cited

U.S. PATENT DOCUMENTS

| | | |
|---|---|---|
| 7,305,574 B2 | 12/2007 | Ferraiolo et al. |
| 7,398,387 B2 | 7/2008 | Liang |
| 7,929,549 B1 | 4/2011 | Talbot |
| 8,060,849 B2 | 11/2011 | He et al. |
| 8,205,047 B2 | 6/2012 | Kopelman |
| 8,726,040 B2 | 5/2014 | Dolgunov et al. |
| 8,745,410 B2 | 6/2014 | Vergnes et al. |
| 9,177,157 B2 | 11/2015 | Binder |
| 9,330,218 B1 | 5/2016 | Chiu et al. |
| 2009/0166887 A1 | 7/2009 | Upadhyayula et al. |
| 2015/0089164 A1 | 3/2015 | Ware et al. |
| 2015/0131397 A1 | 5/2015 | Takeyama et al. |

*Primary Examiner* — Idriss N Alrobaye
*Assistant Examiner* — Dayton Lewis-Taylor
(74) *Attorney, Agent, or Firm* — White & Case LLP

(57) ABSTRACT

A printed circuit board having reduced routing congestion and a method of connecting components on a printed circuit board is disclosed. In one embodiment, a printed circuit board includes a memory controller and memory device. Signal pins of the memory controller and the first memory device are organized into one or more buses based on common functionality, which may be address, data, or command, or any combination thereof. The printed circuit board further includes a plurality of traces connecting each of the signal pins of the memory controller to any one the signal pins of the first memory device belonging to the same bus. The memory controller is configured to associate each one of the signal pins of the memory controller with one of the signal pins of the first memory device that are connected by a plurality of traces.

20 Claims, 11 Drawing Sheets

CIRCUITRY TO ALLEVIATE PRINTED CIRCUIT BOARD ROUTING CONGESTION

CROSS-REFERENCE TO RELATED APPLICATION

This application is a continuation of application Ser. No. 15/455,993, filed Mar. 10, 2017, the entire contents of which are incorporated herein by reference.

FIELD OF THE INVENTION

This invention generally relates to reducing routing congestion on a printed circuit board.

BACKGROUND OF THE INVENTION

A printed circuit board, such as one used in a solid state drive (SSD), may have a memory controller and one or more memory devices attached to one or more surfaces of the printed circuit board. The memory controller and the one or more memory devices, among other components, are mounted on the printed circuit board. The memory controller is responsible for writing data to the memory devices and reading data stored on the memory devices. The memory controller and memory devices each contain a set of signal pins. These signal pins include data signal pins, address signal pins, or command signal pins, or a combination thereof. These signal pins are functionally organized as buses. Each type of signal pin can have its own bus, such as a data bus, or a single set of signal pins can carry multiple types of signals, forming a multiplex bus.

Traces are formed on the surfaces of, or within, the printed circuit board to carry electrical signals between the signal pins of the memory controller and the memory devices. A trace best carries signals when it is short and as direct as possible between an origin pin and a desired destination pin or pins. When a trace is laid out on or within the printed circuit board connecting a plurality of pins such that the trace has a long length, directional changes, or stubs, the signal quality may be degraded, which leads to a slower operation speed for the system.

As printed circuit boards increase in size and complexity, often with a plurality of components mounted on both sides of the printed circuit board, longer and more complex traces may be required to connect each signal pin of the memory controller to a plurality of signal pins on each memory device. Traces are laid out around the layout of the signal pins and around other traces, so they may need to take an indirect path and they may cross over each other in order to reach their desired destination, requiring additional layers to the printed circuit board.

FIG. 1 shows an example of a NAND flash memory device 100, according to the prior art. The NAND flash memory device 100 comprises a plurality of unique data signal pins. In FIG. 1, the NAND flash memory device 100 includes a top eight bit port 102 and a bottom eight bit port 104. The top eight bit port 102 includes an upper eight unique signal pins 106, numbered 0 through 7. The bottom eight bit port 104 includes a lower eight unique signal pins 108, also numbered 0 through 7. The signal pins 106 and 108 may form a multiplex bus that transmits data signals, address signals, or command signals at different times using a method of time-division multiplexing. Therefore, the signal pins 106 and 108 may carry data signals, address signals, or command signals at different times. The NAND flash memory device 100 also includes one or more additional signal pins 110 and 138 for control, power, or any other suitable function.

FIG. 2 shows an example of a configuration of two NAND flash memory devices 212 and 214 placed on opposite surfaces of a printed circuit board 211, according to the prior art. The printed circuit board 211 has a first major surface 213 and a second major surface 215 opposite the first major surface 213. A first NAND flash memory device 212 is attached to the first major surface 213 of the printed circuit board 211, and a second NAND flash memory device 214 is attached to the second major surface 215 of the printed circuit board 211. The first NAND flash memory device 212 and the second NAND flash memory device 214 may be the NAND flash memory device 100 shown and described in connection with FIG. 1, above. While the first NAND flash memory device 212 is shown in FIG. 2 to be slightly offset from the second NAND flash memory device 214 for clarity, the first NAND flash memory device 212 may overlap any portion of the second NAND flash memory device 214.

As previously described in connection with FIG. 1, the first NAND flash memory device 212 includes an upper eight unique signal pins 206 and a lower eight unique signal pins 208. The second NAND flash memory device 214 similarly includes an upper eight unique signal pins 207 and a lower eight unique signal pins 209. In total, the first and second NAND flash memory devices 212 and 214 include four sets of eight unique signal pins each, with each set of eight data signal pins numbered 0 through 7. Each of the eight unique signal pins of a set matches and is identically numbered to one of the eight unique signal pins of every other set.

Because the first NAND flash memory device 212 overlaps the second NAND flash memory device 214, one or more non-matching pairs of data signals pins of the first and second NAND flash memory devices 212 and 214 are located proximate to each other. For example, in FIG. 2 an upper data signal pin 206 of the first NAND flash memory device is numbered 3, and is located proximately above lower data signal pin 207 of the second NAND flash memory device numbered 4.

FIG. 3 shows an example of a conventional layout of traces 316, 318, and 320 for two NAND flash memory devices 312 and 314 placed on opposite sides of a printed circuit board 311, according to the prior art. Again, the first NAND flash memory device 312 and the second NAND flash memory device 314 may be the NAND flash memory device 100 shown and described in connection with FIG. 1, above. The first NAND flash memory device 312 and the second NAND flash memory device 314 may be positioned in a similar manner as the first NAND flash memory device 212 and the second NAND flash memory device 214 as shown and described in FIG. 2.

Three traces 320, 316, and 318 numbered DATA1, DATA3, and DATA6, respectively, are a part of a multiplex bus 305. While three traces 320, 316, and 318 are shown, multiplex bus 305 may include additional traces. As discussed above in connection with FIG. 1, the multiplex bus 305 transmits data signals, address signals, or command signals at different times using time-division multiplexing. To facilitate transmission of data, address, and command signals on the multiplex bus 305, each trace 316, 318, and 320 must be connected to specific signal pins of the first and second NAND flash memory devices 312 and 314: 1) one of the upper eight unique signal pins 306 of the first NAND flash memory device 312; 2) the matching one of the lower eight unique signal pins 308 of the first NAND flash memory device 312; 3) the matching one of the upper eight unique signal pins 307 of the second NAND flash memory device 314; and 4) the matching one of the lower eight unique signal pins 309 of the second NAND flash memory device 314. For example, the trace 316 numbered DATA3 must be connected to the signal pins 306, 307, 308, 309, all of which are numbered 3. Because the multiplex bus 305 transmits command signals at certain times, so the signal pins of the first and second NAND flash memory devices 312 and 314 must be connected by traces 316 in the manner described above. A signal pin 306 or 308 may not be connected arbitrarily to a non-matching signal pin 307 or 309 because, when the multiplex bus 305 is transmitting command signals, the signal pins may correspond to individual bits of an encoded binary command. For example, pin 0 may be the least significant bit and pin 7 the most significant bit of an 8 bit command (with intervening pins corresponding to intervening bits). For a command which is sent from a memory controller (shown in FIG. 4, below) to be correctly interpreted by the NAND flash memory devices 312 and 314, for example, this order must be strictly preserved. Thus, simply arbitrarily connecting non-matching signal pins of the multiplex bus 305 will cause errors or may cause the first and second NAND flash memory devices 312 and 314 to not function entirely.

Because the traces 316, 318, and 320 must be routed in this manner, there is routing congestion of the traces 316, 318, and 320 on and within the printed circuit board 311. For example, routing the trace 316 to connect to the four signal pins 306, 307, 308, and 309 that are all numbered 3, which are located disparately on the first and second NAND flash memory devices 312 and 314, results in a number of congestion problems for the trace 316. The trace 316 is long and includes four stubs 317a-d. Each stub 317a-d is a short trace segment that is connected to the trace 316 at one end only. The trace 316 must cross over other traces 318 and 320 at one or more points proximate to the first and second NAND flash memory devices 312 and 314, requiring routing through additional layers of the printed circuit board 311 to prevent the overlapping traces 316, 318, and 320 from coming into contact with each other. The congestion of the traces 316, 318, and 320 also causes degradation of signal quality for the signals carried by the traces 316, 318, and 320 which leads to a slower operation speed of the multiplex bus 305.

FIG. 4 shows an example of a conventional layout of traces connecting a NAND memory controller 401 to two NAND flash memory devices 412 and 414 placed on opposite sides of a printed circuit board 411, according to the prior art. Again, the first NAND flash memory device 412 and the second NAND flash memory device 414 may be positioned and configured in a similar manner as the first NAND flash memory device 212 and the second NAND flash memory device 214 as shown and described in FIG. 2. The layout of the traces 416, 418, and 420 between the first and second NAND flash memory devices 412 and 414 is similar to the layout of the traces 316, 318, and 320 as shown and described in FIG. 3.

The NAND memory controller 401 includes unique signal pins 419, numbered 0 through 7. Each signal pin 419 of the NAND memory controller 401 matches four specific signal pins of the first and second NAND flash memory devices 412 and 414: 1) the matching one of the upper eight unique signal pins 406 of the first NAND flash memory device 412; 2) the matching one of the lower eight unique signal pins 408 of the first NAND flash memory device 412; 3) the matching one of the upper eight unique signal pins 407 of the second NAND flash memory device 414; and 4) the matching one of the lower eight unique signal pins 409 of the second NAND flash memory device 414.

As previously discussed in connection with FIG. 3, each trace 416, 418, and 420 must connect to matching unique signal pins 406, 407, 408, and 409, such those signal pins numbered 3 connected to the trace 416. In addition to connecting the matching unique signal pins 406, 407, 408, and 409 of the first and second NAND flash memory devices 412 and 414, each trace 416, 418, and 420 must also be connected to a matching unique signal pin 419 of the NAND memory controller 401. For example, the trace 416 numbered DATA3 is connected a signal pin 419 labeled 3 of the NAND memory controller 401, and to the four data signal pins 406, 407, 408, and 409 numbered 3 of the first and second NAND flash memory devices 412 and 414. Again, this is because the signal pins 406, 407, 408, and 409 also may not be simply arbitrarily connected to a non-matching signal pin 419 of the NAND memory controller 401 because, when the multiplex bus 305 is transmitting command signals between the NAND memory controller 401 and the first and second NAND flash memory devices 412 and 414, the command signals must be transmitted in a fixed order.

Thus, in addition to the congestion of the traces 416, 418, and 420 between the first and second NAND memory devices 412 and 414 previously described in FIG. 3, the connection to the matching unique signal pins 419 of the memory controller 401 may require the traces 416, 418, and 420 to further cross over each other at one or more points proximate to the NAND memory controller 401, creating further congestion of the traces 416, 418, and 420 on or within the printed circuit board 411.

The present invention provides a novel approach for alleviating printed circuit board routing congestion without compromising the integrity of buses connecting components on the printed circuit board.

BRIEF DESCRIPTION OF THE INVENTION

In one embodiment, a printed circuit board includes a memory controller having a plurality of pins and a first memory device having a plurality of pins. The memory controller is attached to a first major surface of the printed circuit board and the first memory device is attached to the first major surface or a second major surface opposite the first major surface of the printed circuit board. The signal pins of the memory controller and the first memory device are organized into one or more buses based on common functionality, wherein the common functionality includes address, data, or command, or any combination thereof.

The printed circuit board further includes a plurality of traces on at least one of the first or second major surface of the printed circuit board, or within the printed circuit board, connect the signal pins of the memory controller to the signal pins of the first memory device. Each of the traces connects one of the signal pins of the memory controller to any one of the signal pins of the first memory device belonging to the same bus. The memory controller is configured to associate each one of the signal pins of the memory controller with the one of the signal pins of the first memory device that are connected by the plurality of traces. In one embodiment, the memory controller is non-programmable. In one embodiment, at least one of the buses is a multiplex bus. In one embodiment, the multiplex bus includes commands.

In one embodiment, the printed circuit board further includes a second memory device attached to the first or second major surface of the printed circuit board. The second memory device has a plurality of signal pins organized into the one or more buses based on common functionality. In one embodiment, the plurality of traces further connects the signal pins of the memory controller to the signal pins of the second memory device. Each of the traces connects one of the signal pins of the memory controller to any one of the signal pins of the second memory device belonging to the same bus. In one embodiment, the memory controller is configured to associate each one of the signal pins of the memory controller with the one of the signal pins of the second memory device that are connected by the plurality of traces.

In one embodiment, the first memory device is attached to the first major surface and the second memory device is attached to the second major surface. The printed circuit board further includes one or more vias within the printed circuit board connecting at least one of the signal pins of the first memory device to one of the signal pins of the second memory device. In one embodiment, the first memory device overlaps the second memory device. In one embodiment, the memory controller is further configured to associate each one of the signal pins of the first memory device with the one of the signal pins of the second memory device that are connected by the one or more vias.

In one embodiment, the memory controller stores a set of associations corresponding to each of the signal pins of the memory controller that are connected to one of the signal pins of the first memory device by the plurality of traces. In another embodiment, a set of associations corresponding to each of the signal pins of the memory controller that are connected to one of the signal pins of the first memory device by the plurality of traces is stored external to, and is accessible by, the memory controller.

In one embodiment, a method of connecting a memory controller to one or more memory devices on a printed circuit board includes attaching the memory controller having a plurality of signal pins to a first major surface of the printed circuit board. The method further includes attaching a first memory device having a plurality of signal pins to the first major surface or a second major surface opposite the first major surface of the printed circuit board. The method further includes organizing the signal pins of the memory controller and the first memory device into one or more buses based on common functionality, wherein the common functionality includes address, data, or command, or any combination thereof.

The method further includes routing a plurality of traces on at least one of the first major surface of the printed circuit board, the second major surface of the printed circuit board, or within the printed circuit board to connect the signal pins of the memory controller to the signal pins of the first memory device. Each of the plurality of traces connects one of the signal pins of the memory controller to any one of the signal pins of the first memory device belonging to the same bus. The method further includes associating, with the memory controller, each one of the signal pins of the memory controller with one of the signal pins of the first memory device that are connected by the plurality of traces. In one embodiment, the memory controller is non-programmable. In one embodiment, at least one of the buses is a multiplex bus. In one embodiment, the multiplex bus includes commands.

In one embodiment, the method further includes attaching a second memory device having a plurality of signal pins to the first major surface or the second major surface of the printed circuit board. The method further includes routing the plurality of traces such that they further connect the signal pins of the memory controller to the signal pins of the second memory device. Each of the plurality of traces connects one of the signal pins of the memory controller to any one of the signal pins of the second memory device belonging to the same bus. The method further includes associating, with the memory controller, each one of the signal pins of the memory controller with one of the signal pins of the second memory device that are connected by the plurality of traces.

In one embodiment, the first memory device is attached to the first major surface and the second memory device is attached to the second major surface. The method further includes providing one or more vias within the printed circuit board, the one or more vias connecting at least one of the signal pins of the first memory device to one of the signal pins of the second memory device. In one embodiment, the first memory device overlaps the second memory device. In one embodiment, the method further includes associating, with the memory controller, each one of the signal pins of the first memory device with the one of the signal pins of the second memory device that are connected by the one or more vias.

In one embodiment, the method further includes storing, in the memory controller, a set of associations corresponding to each of the signal pins of the memory controller that are connected to one of the signal pins of the first memory device by the plurality of traces. In another embodiment, the method further includes storing, in a device external to and accessible by the memory controller, a set of associations corresponding to each of the signal pins of the memory controller that are connected to one of the signal pins of the first memory device by the plurality of traces.

DETAILED DESCRIPTION OF THE INVENTION

Figure 5:
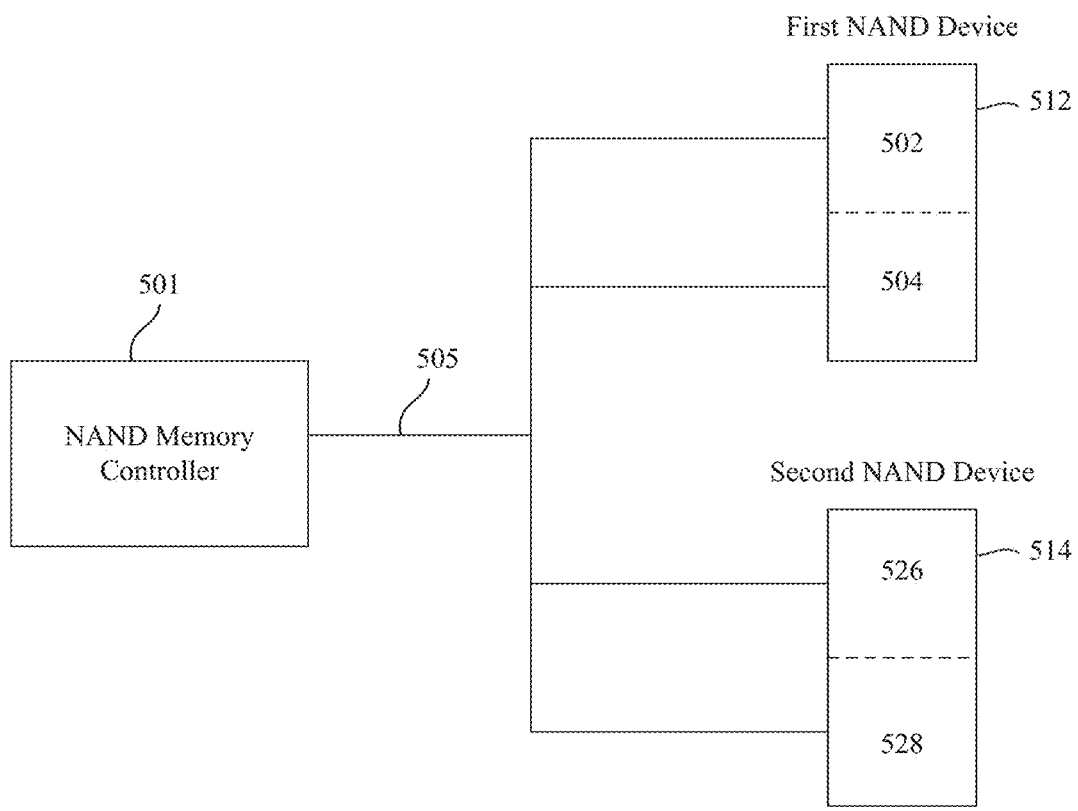
FIG. 5 is a block diagram of the structure of an interface between a memory controller and two memory devices, according to one embodiment of the invention.

FIG. 5 is a block diagram of the structure of an interface between a memory controller 501 and two memory devices 512 and 514, according to one embodiment of the invention. The memory controller 501 is connected by a multiplex bus 505 to the first flash memory device 512 and the second memory device 514. The first memory device 512 includes a top port 502 and a bottom port 504. The second memory device 514 includes a top port 526 and a bottom port 528. The multiplex bus 505 connects the memory controller 501 to the ports 502, 504, 526, 528. During operation, the memory controller 501 is configured to communicate with the memory devices 512 and 514 using signals transmitted over the multiplex bus 505. The multiplex bus 505 may be configured to transmit and receive data signals, address signals, or command signals, or any combination thereof, at different times using time-division multiplexing.

The first and second memory devices 512 and 514 may be any suitable solid-state memory device. In one embodiment, the first and second memory devices 512 and 514 may be NAND flash memory devices. In another embodiment, the first and second devices 512 and 514 may be DRAM devices. The memory controller 501 may be any suitable memory controller device for controlling the first and second memory devices 512 and 514. In one embodiment, the memory controller 501 is a NAND flash memory controller. In one embodiment, the memory controller 501 is a non-programmable controller.

While only two memory devices 512 and 514 and a single multiplex bus 505 are shown in FIG. 5 for simplicity, the number of memory devices and the number of multiplex buses connecting the memory devices to the NAND memory controller 501 are not so limited, and may vary depending on the specific configuration of the printed circuit board and the components attached thereon within the scope of the present invention. Moreover, the memory devices 512 and 514 are not limited to the two ports shown in FIG. 5. Two or more ports on a single memory device may also be connected to two or more distinct buses.

Figure 6:
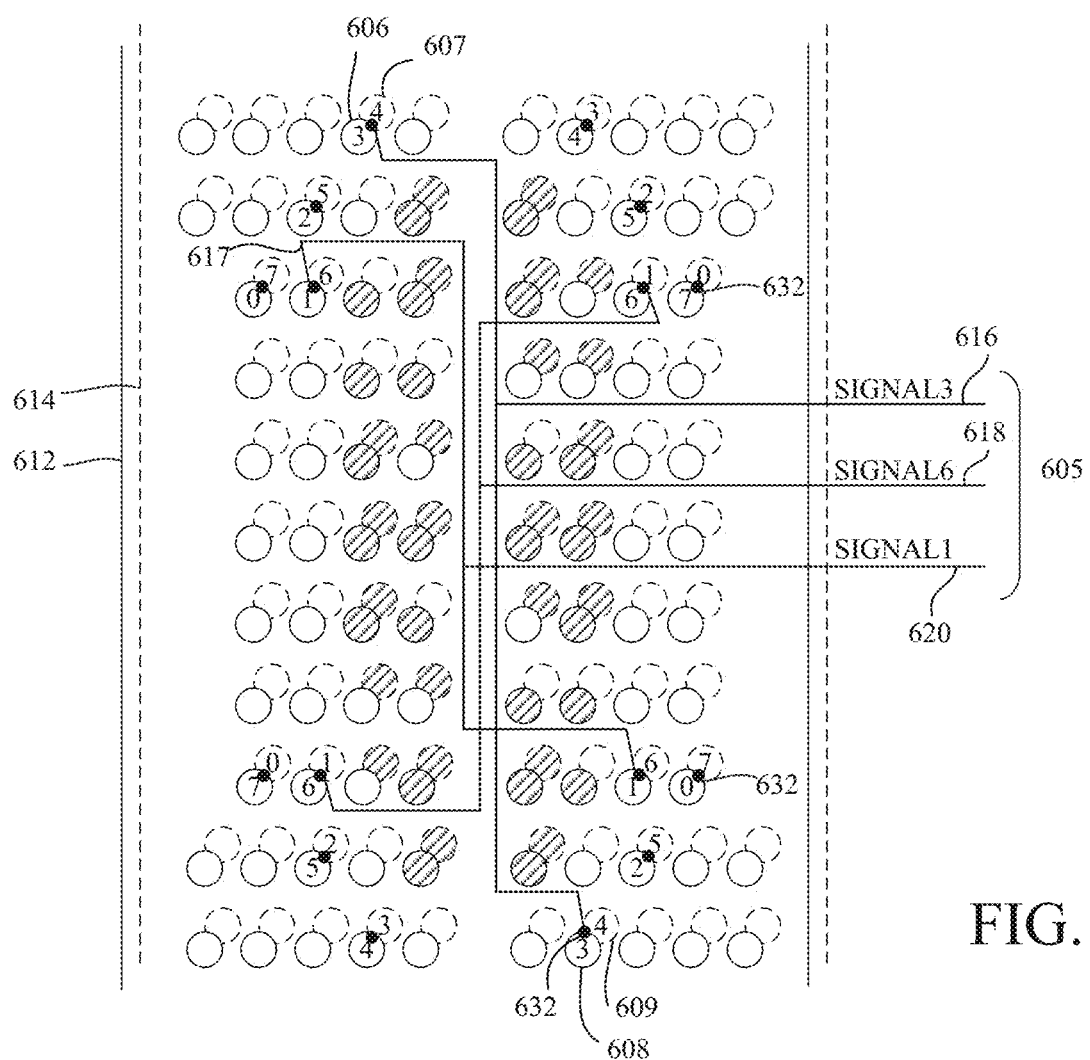
FIG. 6 shows a layout of traces of a multiplex bus having a reduced congestion connecting two NAND flash memory devices placed on opposite surfaces of a printed circuit board without violating the functionality of the multiplex bus, according to one embodiment of the invention.

FIG. 6 shows a layout of traces 616, 618, and 620 of a multiplex bus 605 having a reduced congestion connecting two NAND flash memory devices 612 and 614 placed on opposite surfaces of a printed circuit board without violating the functionality of the multiplex bus 605, according to one embodiment of the invention. In this embodiment, the first and second NAND flash memory device 612 and 614 have identical signal pin layouts similar to the NAND flash memory devices 312 and 314 shown and described in connection with FIG. 3. The signal pin layouts are not limited to the layout shown in the FIGS., and in other embodiments the first and second NAND flash memory devices 612 and 614 may have any number of unique signal pins arranged in any configuration, and functions as data signal pins, command signal pins, or address signal pins, or any combination thereof, arranged in any configuration within the scope of the present invention. While the first NAND flash memory device 612 is shown in FIG. 6 to be slightly offset from the second NAND flash memory device 614 for clarity, in other embodiments the first NAND flash memory device 612 may overlap the second NAND flash memory device 614, or may not overlap at all.

The multiplex bus 605 includes traces 616, 618, and 620, labeled SIGNAL1, SIGNAL3, and SIGNAL6. In other embodiments, the multiplex bus 605 may include more traces within the scope of the present invention. The unique signal pins 606, 607, 608, and 609 of the first and second NAND flash memory devices 612 and 614 function to transmit and/or receive data signals, address signals, or command signals at different times over the traces 616, 618, and 620 using time-division multiplexing. The unique signal pins 606, 607, 608, and 609 of the first and second NAND flash memory devices 612 and 614 having common functionality (i.e. used for data signals, address signals, or command signals, or any combination thereof) form a part of the multiplex bus 605. In other embodiments, a plurality of multiplex busses may be implemented connecting groups of unique signal pins 606, 607, 608, and 609 having different common functionality (i.e. one group of signal pins 606, 607, 608, and 609 used only for command signals forming one multiplex bus; another group of signal pins 606, 607, 608, and 609 used for data and address signals forming another multiplex bus, etc.).

In this embodiment, a number of vias 632 extend from the first major surface of the printed circuit board to the second major surface of the printed circuit board opposite the first major surface. Each via 632 is a segment of a trace 616 forming a conductive path from unique signal pins 606 and 608 of the first NAND flash memory device 612 on the first major surface of the printed circuit board to unique signal pins 607 and 609 of the second NAND flash memory device 614 on the second major surface of the printed circuit board.

As shown in FIG. 6, vias 632 are the shortest connection between unique signal pins 606 and 608 of the first NAND flash memory device 612 and the unique signal pins 607 and 609 of the second NAND flash memory device 614 underlying the unique signal pins 606 and 608 on the opposite side of the printed circuit board. For example, one of the vias 632 connects signal pins 606 and 608 numbered 3 of the first NAND flash memory device 612 to the signal pins 607 and 609 numbered 4 of the second NAND flash memory device 614, another one of the vias 632 connects signal pins 606 and 608 numbered 1 of the first NAND flash memory device 612 to the signal pins 607 and 609 numbered 6 of the second NAND flash memory device 614, and so forth. In other embodiments, for example, where the first and second NAND flash memory devices 612 and 614 are slightly offset or do not overlap, the shortest connection between signal pins 606 and 608 of the first NAND flash memory device 612 and signal pins 607 and 609 of the second NAND flash memory device 614 may include additional short traces as necessary.

Figure 1:
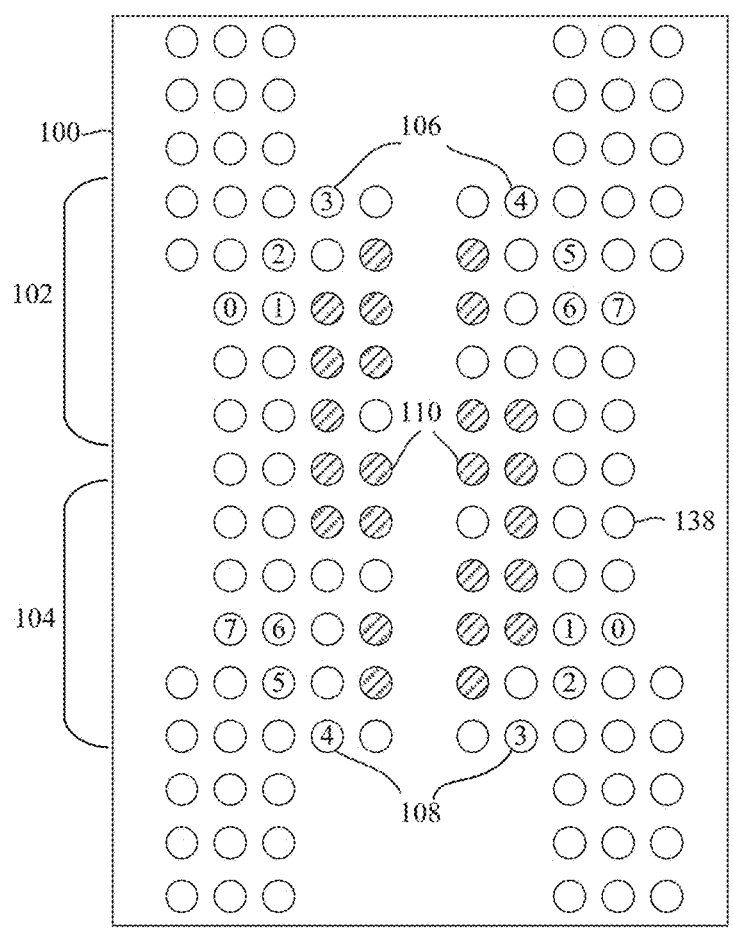
FIG. 1 shows an example of a NAND flash memory device, according to the prior art, according to the prior art.
Figure 2:
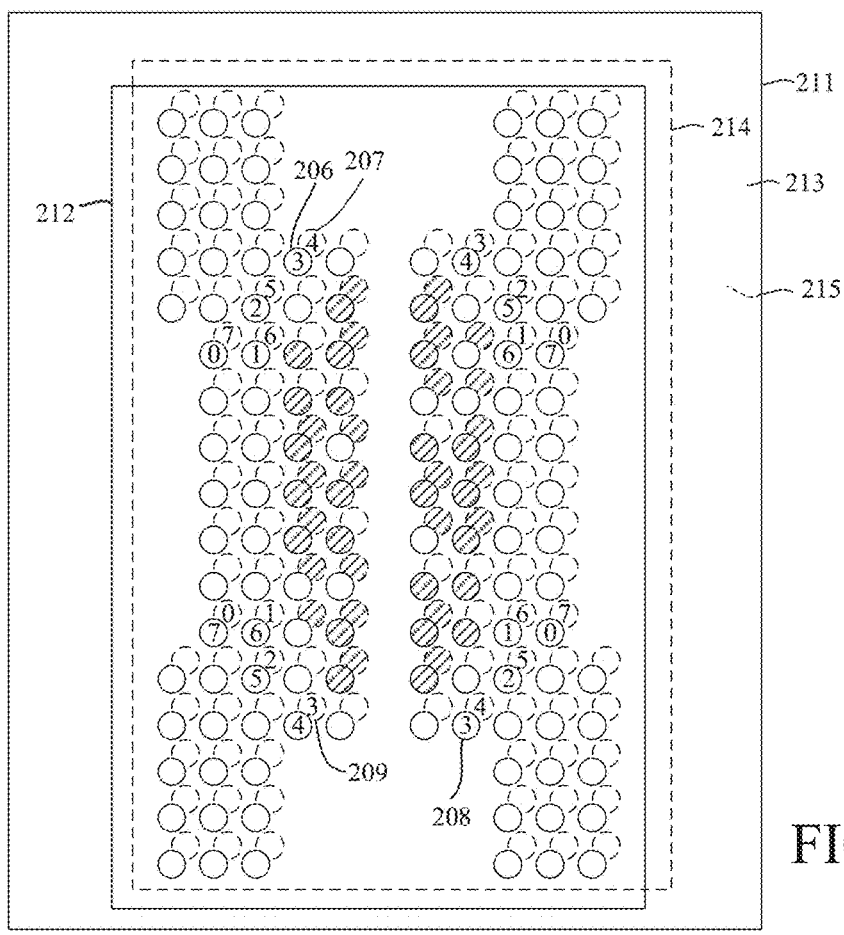
FIG. 2 shows an example of a configuration of two NAND flash memory devices placed on opposite surfaces of a printed circuit board, according to the prior art.
Figure 3:
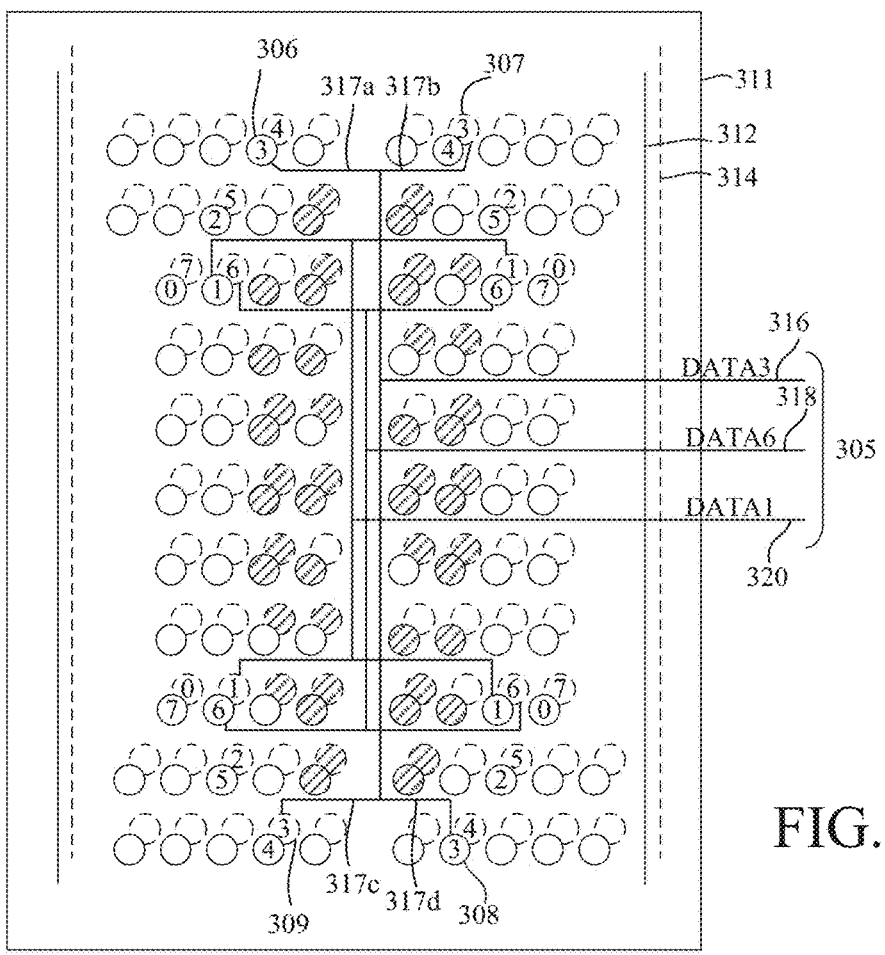
FIG. 3 shows an example of a conventional layout of traces for two NAND flash memory devices placed on opposite sides of a printed circuit board, according to the prior art.
Figure 4:
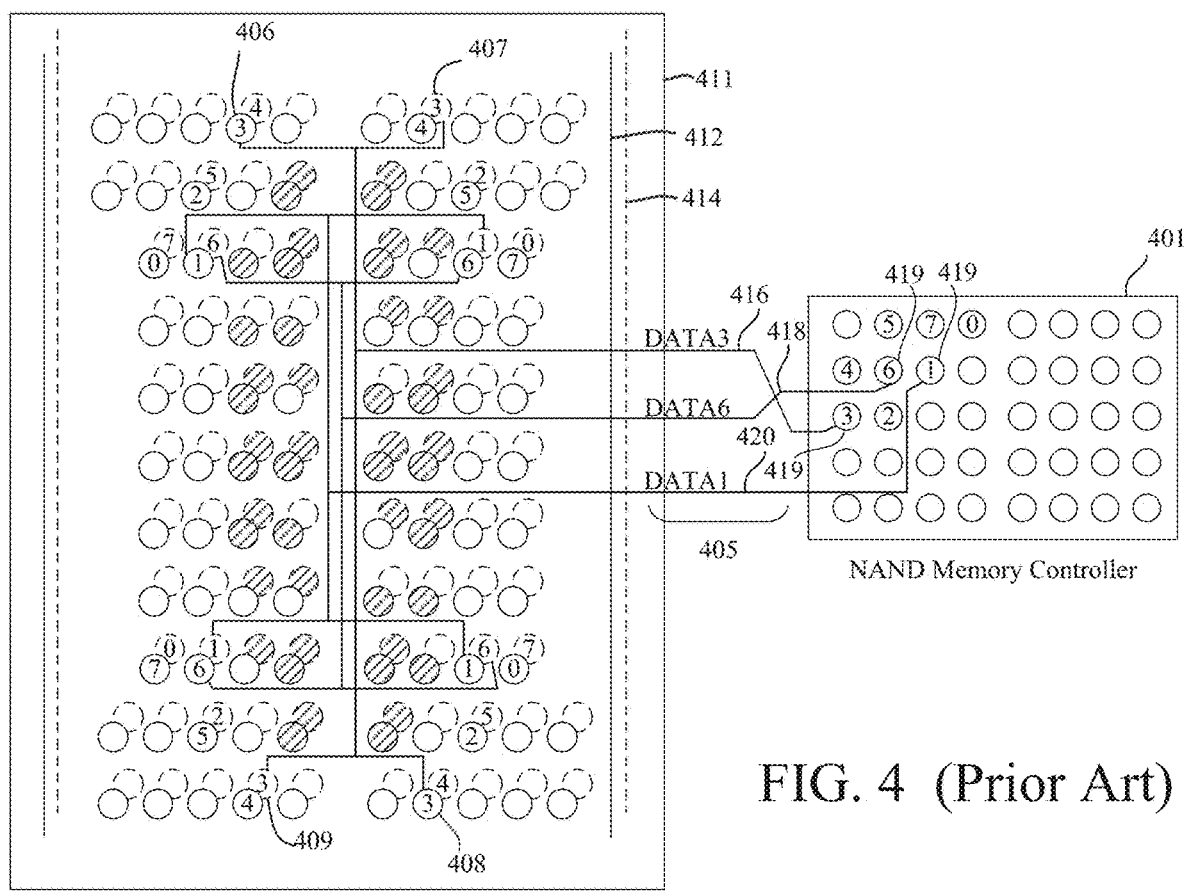
FIG. 4 shows an example of a conventional layout of traces connecting a NAND memory controller to two NAND flash memory devices placed on opposite sides of a printed circuit board, according to the prior art.

Compared to the prior art trace layouts shown in FIG. 3 and FIG. 4, the congestion of traces 616, 618, and 620 of the multiplex bus 605 is reduced in this embodiment because the vias 632 connect differently ordered (i.e. numbered) signal pins of the first and second NAND flash memory devices 612 and 614, and the traces 616, 618, and 620 are connected to the vias 632. As a result, each trace 616, 618, and 620 has fewer stubs, which results in a shorter trace length.

Figure 7:
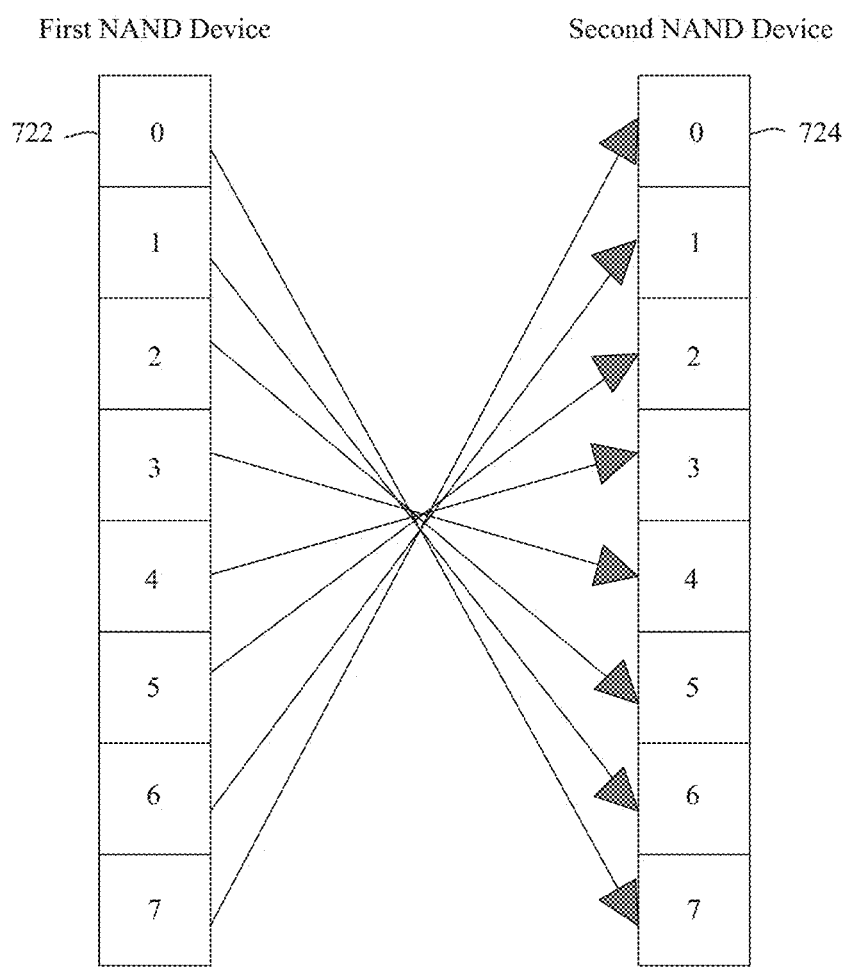
FIG. 7 is a chart showing via connections between unique signal pins of the first and second NAND flash memory devices, according to the embodiment of FIG. 6.

FIG. 7 is a chart showing the via connections between unique signal pins 722 of the first NAND flash memory device and unique signal pins 724 of the second NAND flash memory device, according to the embodiment of FIG. 6. Each via 632 shown in FIG. 6 is represented in FIG. 7 by an arrow extending from unique signal pins 722 of the first NAND flash memory device (not shown) to unique signal pins 724 of the second NAND flash memory device (not shown) on an opposite surface of a printed circuit board, where the unique signal pins 722 of the first NAND flash memory device and the unique signal pins 724 of the second NAND flash memory devices are connected by vias extending through the printed circuit board.

As shown in FIG. 7, the via connections apply to both the signal pins of the top port and the bottom port of the first and second NAND flash memory devices. In other embodiments, the via connections for the signal pins of the top port may be configured differently from the via connections for the signal pins of the bottom port.

Figure 8:
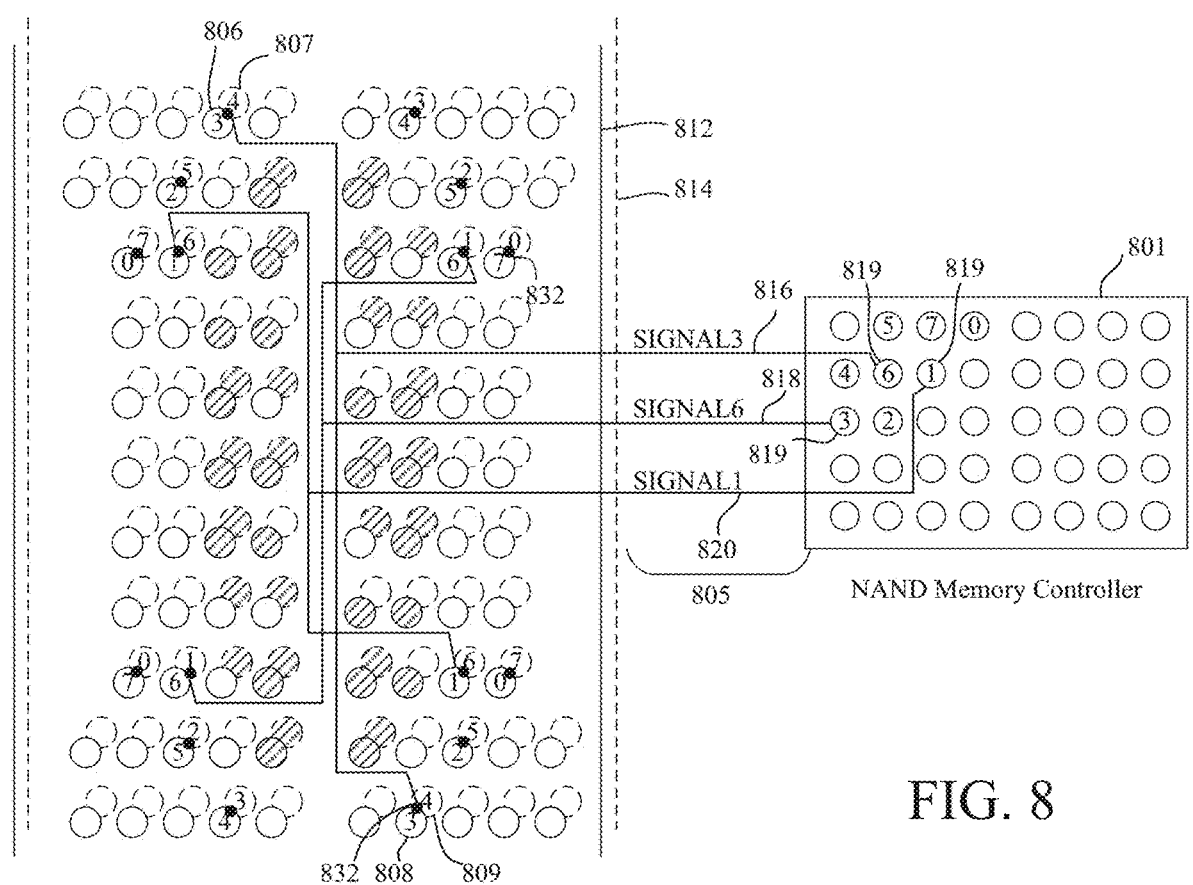
FIG. 8 shows a layout of traces of a multiplex bus having a reduced congestion connecting two NAND flash memory devices placed on opposite surfaces of a printed circuit board and a NAND memory controller without violating the functionality of the multiplex bus, according to one embodiment of the invention.

FIG. 8 shows a layout of traces 816, 818, and 820 of a multiplex bus 805 having a reduced congestion connecting two NAND flash memory devices 812 and 814 placed on opposite surfaces of a printed circuit board and a NAND memory controller 801 without violating the functionality of the multiplex bus 805, according to one embodiment of the invention. The first NAND flash memory device 812 and the second NAND flash memory device 812 are positioned and configured in a similar manner as shown and described in FIG. 6, above. The multiplex bus 805 includes traces 820, 816, 818, labeled SIGNAL1, SIGNAL3, and SIGNAL6, respectively. In other embodiments, the multiplex bus 805 may include more traces within the scope of the present invention The unique signal pins 806, 807, 808, and 809 of the first and second NAND flash memory devices 812 and 814, and the unique signal pins 819 of the NAND memory controller 701 function to transmit and/or receive data signals, address signals, or command signals at different times over the traces 816, 818, and 820 using time-division multiplexing. The unique signal pins 806, 807, 808, and 809 of the first and second NAND flash memory devices 812 and 814 and the unique signal pins 819 of the NAND memory controller 801 having common functionality (i.e. used for data signals, address signals, or command signals, or any combination thereof) form a part of the multiplex bus 805. In other embodiments, a plurality of multiplex busses may be implemented connecting groups of unique signal pins 806, 807, 808, and 809 of the first and second NAND flash memory devices 812 and 814 and the unique signal pins 819 of the NAND memory controller 801 having different common functionality (i.e. one group of signal pins 806, 807, 808, 809, and 819 used only for command signals forming one multiplex bus; another group of signal pins 806, 807, 808, 809, and 819 used for data and address signals forming another multiplex bus, etc.).

In this embodiment, the layout of the traces 816, 818, and 820 between the first and second NAND flash memory devices 812 and 814 is similar to the layout of traces shown in FIG. 6. For example, the trace 816 labeled DATA3 connects to via 832 connecting the signal pin 806 of the first NAND flash memory device 812 numbered 3, and the signal pin 807 of the second NAND flash memory device 814 numbered 4, and connects the signal pin 808 of the first NAND flash memory device 812 numbered 3, and the signal pin 809 of the second NAND flash memory device 814 numbered 4. The trace 816 is further connected to a signal pin 819 of the NAND memory controller 801 numbered 6, instead of a data signal pin 819 numbered 3 as shown in FIG. 4.

This layout of the trace 816 avoids cross over of the trace 816 labeled DATA3 and the trace 818 labeled DATA6 proximate the NAND memory controller 801, as shown in FIG. 4. Similarly, the trace 818 labeled DATA6 is connected to the data signal pin 819 numbered 3 of the NAND memory controller 801, instead of the data signal pin 819 numbered 6. Compared to the prior art trace layout shown in FIG. 4, the level of printed circuit board routing congestion is further reduced in this embodiment because the traces 616 and 618 also connect to differently ordered (i.e. numbered) signal pins of the NAND memory controller 801 so that the two traces 816 and 818 labeled DATA3 and DATA6 are no longer crossing over each other to reach the data signal pins 819 of the NAND memory controller 801.

Figure 9A:
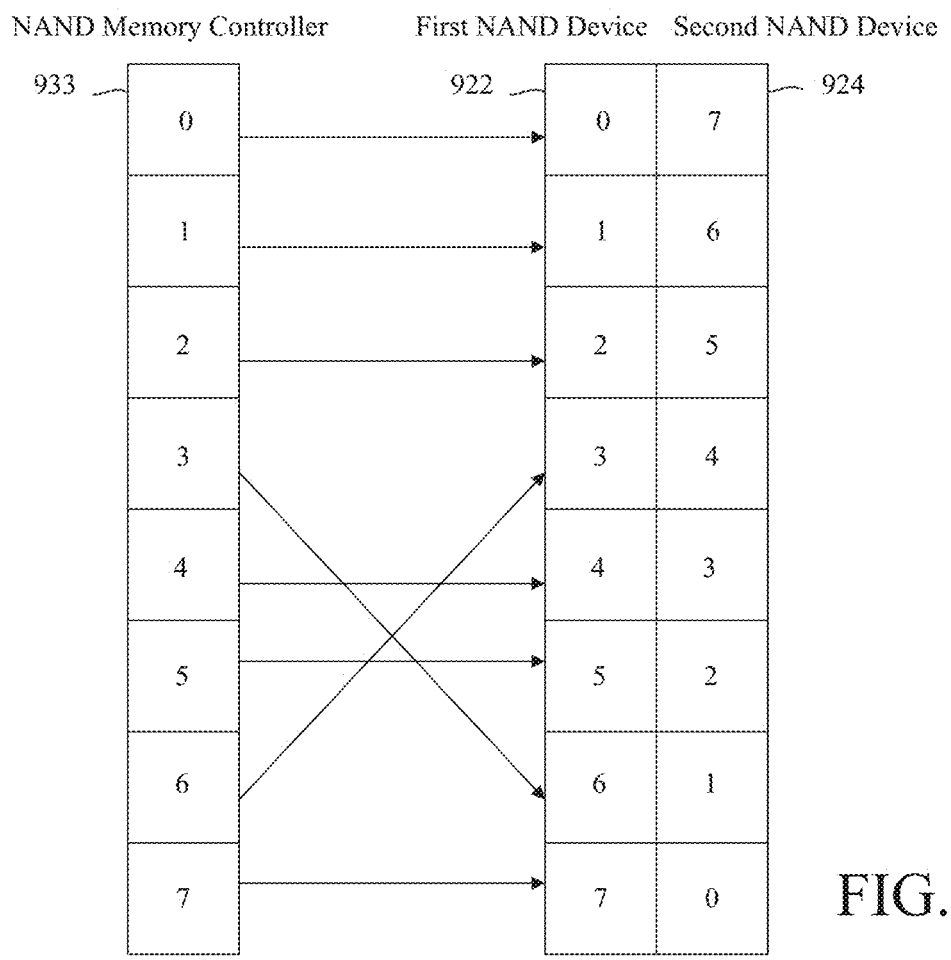
FIGS. 9A-C shows a set of associations accessible by the NAND memory controller reflecting a layout of traces of the multiplex bus, according to the embodiment of FIG. 8.
Figure 9B:
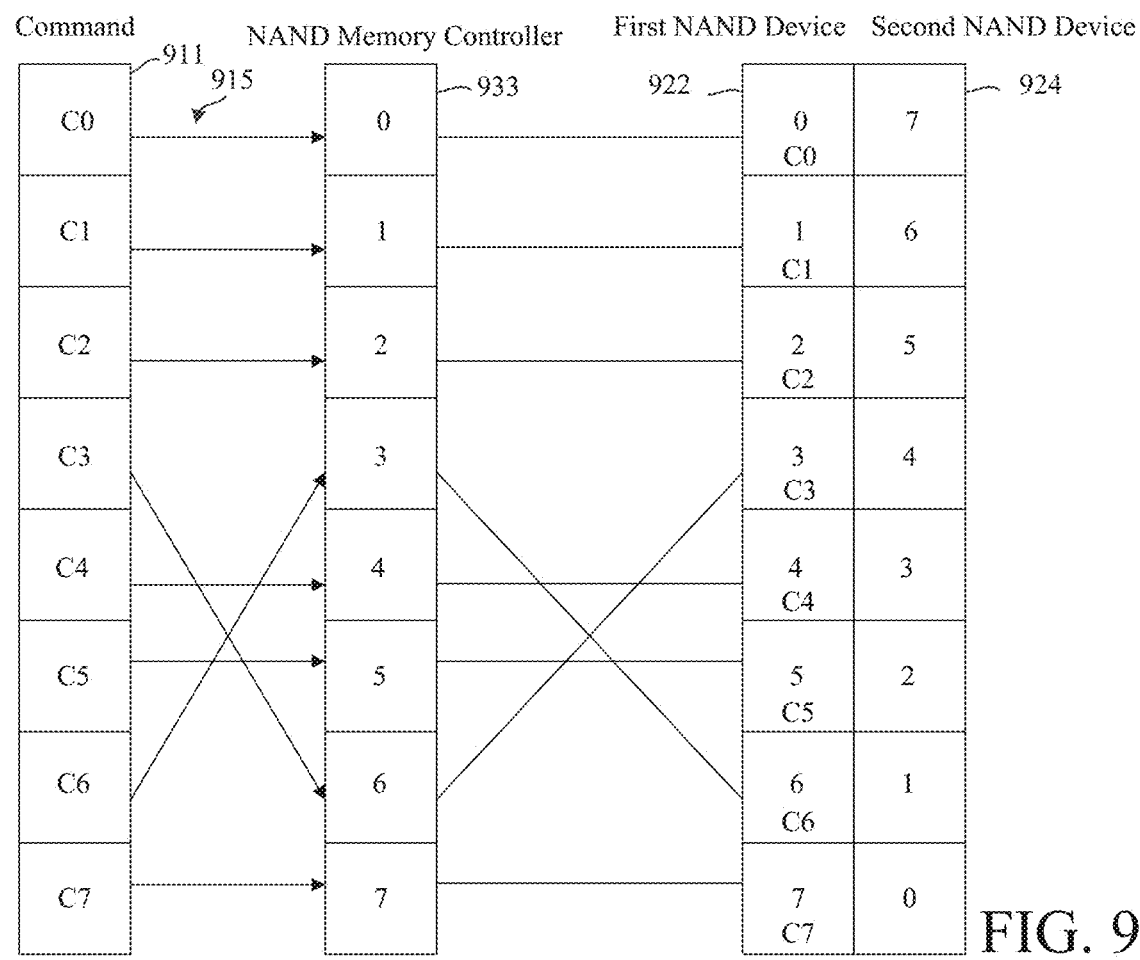
Figure 9C:
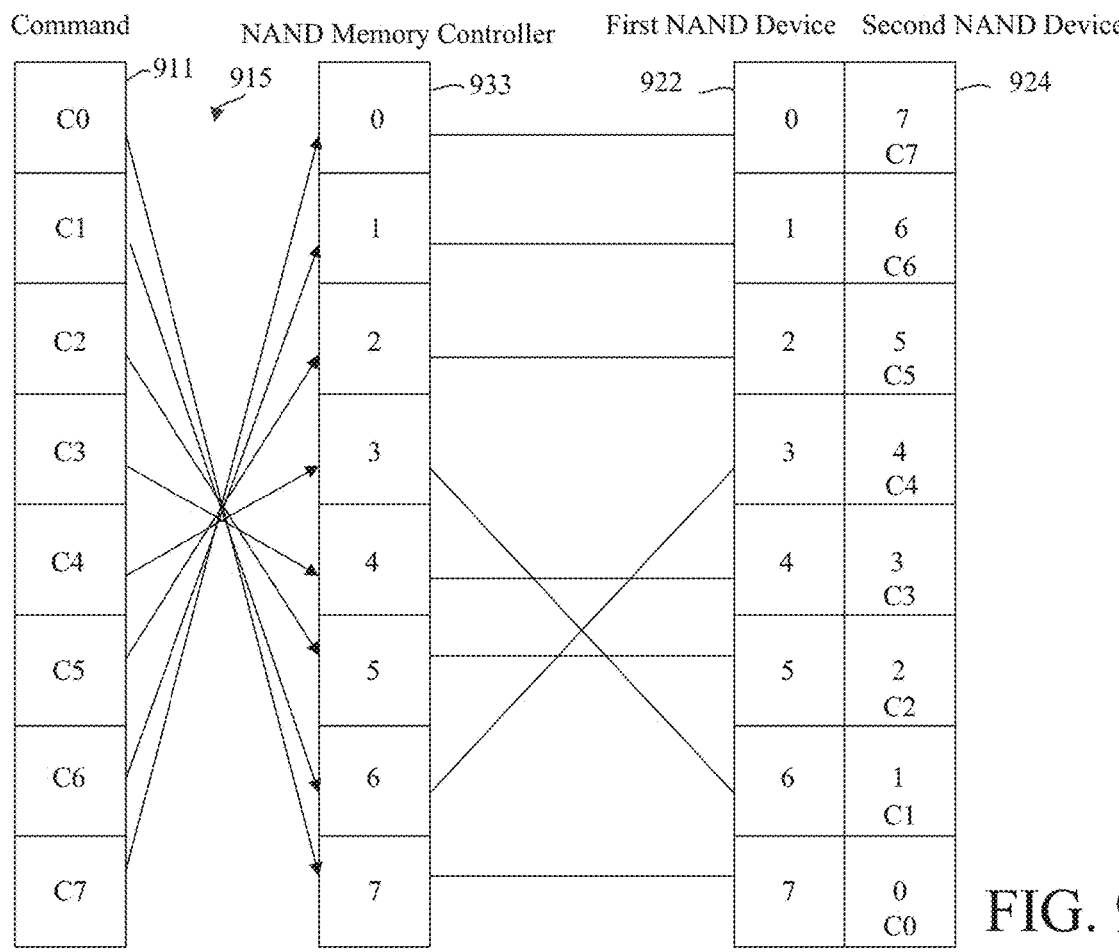

FIGS. 9A-C shows a set of associations accessible by the NAND memory controller reflecting a layout of traces of the multiplex bus, according to the embodiment of FIG. 8. As previously described in connection with FIG. 8, the NAND memory controller (i.e., the NAND memory controller 801 shown in FIG. 8) includes unique signal pins 933, numbered 0 through 7. In other embodiments, the number of unique signal pins 933 of the NAND memory controller is not limited and may be two or more unique signal pins within the scope of the present invention. The NAND memory controller is configured to associate at least one signal pin 933 of the NAND memory controller with a signal pin 922 of the first NAND flash memory device that is connected by a trace to the signal pin 933 of the memory controller.

In view of the layout of traces of the multiplex bus shown in FIG. 8, as shown in FIG. 9A, the memory controller associates a signal pin 933 of the memory controller numbered 0 with a signal pin 922 of the first NAND flash memory device numbered 0, a signal pin 933 numbered 3 of the memory controller with a signal pin 922 numbered 6 of the first NAND flash memory device, a signal pin 933 numbered 6 of the memory controller with a signal pin 922 numbered 3 of the first NAND flash memory device. In other embodiments, other data signal pins of the memory controller and the first NAND flash memory device may be differently associated, depending on the specific layout of the traces connecting the data signal pins of the memory controller and the first NAND flash memory device.

The memory controller is also configured to associate the signal pins 922 of the first NAND flash memory device to the signal pins 924 of the second NAND flash memory device that are connected by a via through the printed circuit board as shown in FIG. 8. For example, the memory controller associates the signal pin 922 numbered 0 of the first NAND flash memory device with signal pin 924 numbered 7 of the second NAND flash memory device. Of course, the set of associations between the signal pins of the first NAND flash memory device and the second NAND flash memory device is not limited to the set of associations shown in FIGS. 9A-C and will depend on the specific connections between the signal pins of the first NAND flash memory devices and the second NAND flash memory device.

The set of associations between the signal pins of the memory controller, the first NAND flash memory device, and the second NAND flash memory device may be stored within the memory controller or externally in another device accessible by the memory controller. Using the set of associations accessible by the memory controller, when the memory controller sends a command to a specified location of the first NAND flash memory device, the memory controller associates the specified location of the first NAND flash memory device with a signal pin 933 of the NAND memory controller that is connected by a trace to the signal pin 922 corresponding to the specified location of the first NAND flash memory device. Similarly, when the memory controller sends a command to a specified location of the second NAND flash memory devices, the memory controller associates the specified location of the second NAND flash memory device with a signal pin 933 of the NAND memory controller that is connected by a trace or via to the signal pin 924 corresponding to the specified location of the second NAND flash memory device.

FIGS. 9B and 9C show an example of the associations 915 performed by the NAND memory controller, according to the embodiment of FIG. 8. As shown in FIG. 9B, the NAND memory controller is configured to perform an association 915 for an 8 bit command 911 labeled C0 through C7 before sending the commands C0 through C7 through the traces connecting the signal pins 933 of the NAND memory controller and the signal pins 922 of the first NAND flash memory device in order to ensure that the commands C0 through C7 arrive at the signal pins 922 of the first NAND flash memory device with the bits of the 8 bit command 911 in order (i.e. commands C0 through C7 arriving at pins 922 numbered 0 through 7, respectively). For example, the NAND memory controller associates command C3 with its signal pin 933 numbered 6, which is connected by a trace to pin 922 of the first NAND flash memory device numbered 3, so that command C3 correctly arrives at the pin 922 numbered 3. Similarly, the NAND memory controller associates command C6 with its signal pin 933 numbered 3, so that the command C6 correctly arrives at the pin 922 numbered 6. The NAND memory controller performs similar associations for the other bits of the 8 bit command 911.

Similar to FIG. 9B, as shown in FIG. 9C, the NAND memory controller is also configured to perform an association 915 for an 8 bit command 911 labeled C0 through C7 before sending the commands C0 through C7 through the traces connecting the signal pins 933 of the NAND memory controller and the signal pins 924 of the second NAND flash memory device in order to ensure that the commands C0 through C7 arrive at the pins 924 of the second NAND flash memory device with the bits of the 8 bit command 911 in order (i.e. commands C0 through C7 arriving at pins 924 numbered 0 through 7, respectively). For example, the NAND memory controller associates command C0 with its signal pin 933 numbered 7, which is connected by a trace to pin 924 of the second NAND memory device numbered 0, so that command C0 correctly arrives at the pin 924 numbered 0. Similarly, the NAND memory controller associates command C7 with its signal pin 933 numbered 0, so that the command C7 correctly arrives at the pin 924 numbered 7. The NAND memory controller performs similar associations for the other bits of the 8 bit command 911.

Other objects, advantages and embodiments of the various aspects of the present invention will be apparent to those who are skilled in the field of the invention and are within the scope of the description and the accompanying Figures. For example, but without limitation, structural or functional elements might be rearranged, or method steps reordered, consistent with the present invention. Similarly, principles according to the present invention could be applied to other examples, which, even if not specifically described here in detail, would nevertheless be within the scope of the present invention.

What is claimed is:

1. A printed circuit board (PCB) system comprising:
 a PCB;
 a first memory device communicatively coupled to the PCB and having a first plurality of signal pins arranged in a first order of a first $pin_1$ through a first $pin_x$ (x being an integer);
 a memory controller communicatively coupled to the PCB and having a second plurality of signal pins arranged in a second order of a second $pin_1$ through a second $pin_y$ (y being an integer); and
 a plurality of traces disposed in or on the PCB and communicatively coupling the first plurality of signal pins to the second plurality of signal pins, wherein
  a first stored set of associations corresponds to the plurality of traces coupling the first plurality of signal pins and the second plurality of signal pins,
  at least two first pins of the first plurality of signal pins arranged in the first order and at least two second pins of the second plurality of signal pins arranged in the second order, the first order being different from the second order, and
  the memory controller is configured to:
   read the first stored set of associations, and
   transmit to or receive data from the first memory device through the plurality of traces according to the first stored set of associations.

2. The PCB system of claim 1, wherein the first stored set of associations is stored on a device separate from the first memory device.

3. The PCB system of claim 1, wherein the memory controller is non-programmable.

4. The PCB system of claim 1, wherein the first plurality of signal pins and the second plurality of signal pins are organized into one or more buses based on common functionality.

5. The PCB system of claim 1, wherein the first stored set of associations is stored external to the memory controller.

6. The PCB system of claim 1, further comprising:
 a second memory device communicatively coupled to the PCB and having a third plurality of signal pins arranged in a third order of a third $pin_1$ through a third $pin_z$ (z being an integer);
 the plurality of traces further communicatively coupling the third plurality of signal pins to the second plurality of signal pins, wherein
  a second stored set of associations corresponds to the plurality of traces coupling the second plurality of signal pins and the third plurality of signal pins,
  at least two second pins of the second plurality of signal pins arranged in the second order and at least two third pins of the third plurality of signal pins arranged in the third order, the third order being different from the second order, and
  the memory controller is further configured to:
   read the second stored set of associations, and
   transmit to or receive data from the second memory device through the plurality of traces according to the second stored set of associations.

7. The PCB system of claim 6, wherein the PCB comprises one or more vias, and wherein
 the memory controller is communicatively coupled to a first major surface of the PCB or a second major surface of the PCB,
 the first memory device is communicatively coupled to the first major surface, the second memory device is communicatively coupled to the second major surface, and
 the one or more vias communicatively coupling at least one of the first plurality of signal pins to one of the third plurality of signal pins.

8. The PCB system of claim 7, wherein the first memory device overlaps the second memory device.

9. The PCB system of claim 7, wherein a third stored set of associations corresponds to the at least one of the first plurality of signal pins and the at least one of the third plurality of signal pin communicatively coupled by the one or more vias.

10. The PCB system of claim 7, wherein the second stored set of associations is stored on a device separate from the first memory device and the second memory device.

11. A method of connecting a memory controller to one or more memory devices on a printed circuit board (PCB), the method comprising:
communicatively coupling a first memory device, having a first plurality of signal pins arranged in a first order of a first $pin_1$ through a first $pin_x$ (x being an integer), to the PCB;
communicatively coupling a memory controller, having a second plurality of signal pins arranged in a second order of a second $pin_1$ through a second $pin_y$ (y being an integer), to the PCB;
routing a plurality of traces, the plurality of traces communicatively coupling the first plurality of signal pins to the second plurality of signal pins;
storing a first set of associations, the first stored set of associations corresponds to the plurality of traces coupling the first plurality of signal pins and the second plurality of signal pins,
at least two first pins of the first plurality of signal pins arranged in the first order and at least two second pins of the second plurality of signal pins arranged in the second order, the first order being different from the second order,
configuring the memory controller to:
read the first stored set of associations, and
transmit to or receive data from the first memory device through the plurality of traces according to the first stored set of associations.

12. The method of claim 11, further comprising storing the first set of associations on a device separate from the first memory device.

13. The method of claim 11, wherein the memory controller is non-programmable.

14. The method of claim 11, wherein the first plurality of signal pins and the second plurality of signal pins are organized into one or more buses based on common functionality.

15. The method of claim 11, further comprising storing the first set of associations external to the memory controller.

16. The method of claim 11, further comprising:
communicatively coupling a second memory device to the PCB having a third plurality of signal pins arranged in a third order of a third $pin_1$ through a third $pin_z$ (z being an integer) to the printed circuit board;
routing the plurality of traces to further communicatively couple the second plurality of signal pins to the third plurality of signal pins;
storing a second set of associations, the second stored set of associations corresponds to the plurality of traces coupling the second plurality of signal pins and the third plurality of signal pins,
at least two second pins of the second plurality of signal pins arranged in the second order and at least two third pins of the third plurality of signal pins arranged in the third order, the second order being different from the third order, and
further configuring the memory controller to:
read the second stored set of associations between the second plurality of signal pins and the third plurality of signal pins, and
transmit to or receive data from the second memory device through the plurality of traces according to the second stored set of associations.

17. The method of claim 16, further comprising:
providing one or more vias within the printed circuit board, the one or more vias communicatively coupling at least one of the first plurality of signal pins and at least one of the third plurality of signal pins,
wherein communicatively coupling the first memory device comprises communicatively coupling the first memory device to a first major surface of the printed circuit board, communicatively coupling the second memory device comprises communicatively coupling the second memory device to a second major surface of the printed circuit board, and communicatively coupling the memory controller comprises communicatively coupling the memory controller to the first major surface or the second major surface.

18. The method of claim 17, wherein communicatively coupling the first memory device and the second memory device further comprises overlapping the first memory device and the second memory device.

19. The method of claim 17, further comprising storing a third stored set of associations corresponding to the at least one of the first plurality of signal pins and the at least one of the third plurality of signal pin communicatively coupled by the one or more vias.

20. The method of claim 17, further comprising storing the second set of associations on a device separate from the first memory device and the second memory device.

* * * * *